United States Patent
Ho et al.

(10) Patent No.: US 7,444,733 B2
(45) Date of Patent: Nov. 4, 2008

(54) ALIGNMENT PRECISION ENHANCEMENT OF ELECTRONIC COMPONENT PROCESS ON FLEXIBLE SUBSTRATE DEVICE AND METHOD THEREOF THE SAME

(75) Inventors: Jia-Chong Ho, Taipei Hsien (TW); Tarng-Shiang Hu, Hsin Chu (TW); Hsiang-Yuan Cheng, Taipei (TW)

(73) Assignee: Industrial Technology Research Institute, Hsinchu County (TW)

( * ) Notice: Subject to any disclaimer, the term of this patent is extended or adjusted under 35 U.S.C. 154(b) by 387 days.

(21) Appl. No.: 11/289,356

(22) Filed: Nov. 30, 2005

(65) Prior Publication Data

US 2007/0049064 A1 Mar. 1, 2007

(30) Foreign Application Priority Data

Aug. 30, 2005 (TW) .............................. 94129713 A

(51) Int. Cl.
*H01S 4/00* (2006.01)
*H05K 3/30* (2006.01)
*H05K 3/02* (2006.01)
*G01R 3/00* (2006.01)

(52) U.S. Cl. .................. 29/592.1; 29/825; 29/832; 29/834; 29/835

(58) Field of Classification Search .............. 29/830, 29/832, 834, 412, 417, 738, 739, 740, 760, 29/564.1, 564.2, 564.3, 835, 829; 83/929.1, 83/929.2, 942, 13; 125/23.01; 451/41
See application file for complete search history.

(56) References Cited

U.S. PATENT DOCUMENTS

| | | | |
|---|---|---|---|
| 6,121,880 A * | 9/2000 | Scott et al. | 340/572.5 |
| 6,413,796 B1 * | 7/2002 | Noh et al. | 438/108 |
| 6,626,222 B1 * | 9/2003 | VanNortwick | 156/518 |
| 6,794,673 B2 * | 9/2004 | Gosain et al. | 257/22 |
| 6,824,320 B1 * | 11/2004 | Kerr et al. | 396/512 |
| 7,073,723 B2 * | 7/2006 | Furst et al. | 235/492 |
| 7,257,892 B2 * | 8/2007 | Sato et al. | 29/846 |
| 7,279,401 B2 * | 10/2007 | Wong et al. | 438/458 |
| 7,309,925 B2 * | 12/2007 | Matsumura et al. | 257/797 |
| 2003/0032210 A1 * | 2/2003 | Takayama et al. | 438/30 |
| 2005/0014313 A1 * | 1/2005 | Workman et al. | 438/127 |
| 2006/0189023 A1 * | 8/2006 | Chang et al. | 438/69 |
| 2006/0200985 A1 * | 9/2006 | Workman et al. | 29/860 |
| 2006/0238989 A1 * | 10/2006 | Manes et al. | 361/760 |
| 2007/0059854 A1 * | 3/2007 | Huang et al. | 438/30 |

* cited by examiner

*Primary Examiner*—Peter DungBa Vo
*Assistant Examiner*—David P Angwin
(74) *Attorney, Agent, or Firm*—Rabin & Berdo, P.C.

(57) ABSTRACT

Alignment precision enhancement of electronic component process on flexible substrate device and method thereof the same is proposed. The process step of a flexible substrate is put on a substrate holder, wherein the flexible substrate is fixed by a polymer tape. A plural of alignment marks is making for lithography process. An unstressed cut is separated the flexible substrate and substrate holder when the electronic component is made.

14 Claims, 7 Drawing Sheets

ALIGNMENT PRECISION ENHANCEMENT OF ELECTRONIC COMPONENT PROCESS ON FLEXIBLE SUBSTRATE DEVICE AND METHOD THEREOF THE SAME

BACKGROUND OF THE INVENTION

1. Field of the Invention

The present invention is related to an alignment precision enhancement device of an electronic component process and a method thereof the same, and more particularly to an alignment precision enhancement device of an electronic component process on a flexible substrate and a method thereof the same.

2. Description of Related Art

Presently, when making electronic components on a plastic substrate process, a glass substrate is used to be a holder for adhering the plastic substrate to the holder, and than after finishing the process, the plastic substrate is separated from the holder. However, the drawback of this process is that it is necessary to find a special binder, which can bear a process temperature about 200° C., and further, a photo destruction should be used to separate the plastic substrate from the glass holder without leaving any binder thereon. In this manner, the selection for the material of the binder is significantly restricted, besides the binder is coated on the substrate before the holder is pasted thereon so that it is uneasy to control the surface of the plastic substrate to be smooth, and also, the process is complicated.

Organic film transistors are made of organic conjugate macromolecule or oligomolecule. Compared with the conventional inorganic transistors, the organic film transistors can be made under a low temperature so that the substrate can be selected to be a light, thin and cheap plastic instead of the glass. In addition, the process for the organic film transistor is simpler, in which the organic film is directly patterned by printing for reducing the number of photomask in use and also saving the vacuum evaporator, and the process is suitable for the plastic substrate so that it is highly compatible with the future roll-to-roll process and also can reduce the manufacturing cost. According to a prediction by Xerox company in U.S., the cost thereof can be reduced to one tenth of ten as compared to the conventional semiconductor process. However, when making electric components on the flexible substrate, first of all, the problem should be overcome is an alignment deviation caused by a deformation of the substrate that is produced owing to the temperature and the stress.

In the manner of adhering the plastic substrate to a carrier by sealant, the material of seal should be deaerated process before be filled into the syringe for coating. After uniformly coating the sealant on the glass carrier, the glass carrier and the plastic substrate are pressed together by a press machine and simultaneously heated or illuminated for pre-fixation. If the oxygen requirement is as little as possible, then this step should be performed in vacuum, and thus, it will need a large vacuum chamber for accommodating the vacuum press machine and the exposure machine, which may cost a lot.

Therefore, the drawbacks are:

1. The sealant needs to be deaerated.

2. If a thermoplastic sealant is used and the air included therein is going to be removed, a heating press machine should be used for pressing in vacuum. If an UV type plastic material is used, a press machine with UV light source should be used in the vacuum chamber, which is expensive and complicated.

3. If there is air included between the plastic substrate and the glass, the sealant line might be broken owing to a punch so that after multiple processes, the solution may enter therein easily through the broken hole of the sealant so as to influence the whole process. As to another problem relating to the air included therein, if the air included between the plastic substrate and the glass substrate is too much, the flatness of the substrate might be influenced owing to the expanded air volume caused by the heating during the process so that the film making on the substrate may become not uniform.

4. Because the stresses of the plastic substrate at the positions with and without sealant are different, the substrate might be split at the position near the seal after multiple processes.

SUMMARY OF THE INVENTION

In consideration of the defects of the described conventional technology and for solving the problems above, the present invention provides an alignment precision enhancement device of an electronic component process on a flexible substrate and a method thereof the same so that the alignment precision of the flexible substrate can be improved to be suitable for a roll-to-roll process when making the electronic component on the flexible substrate.

For achieving the purposes described above, the present invention provides an alignment precision enhancement method of an electronic component process on a flexible substrate, comprising steps of: placing the flexible substrate on a substrate holder; completely sticking the flexible substrate by a polymer tape using a press machine, thereby the flexible substrate is adhesively fixed on the substrate holder through the polymer tape; setting up a plural of alignment mark areas and removing the polymer tape within those alignment mark areas; depositing an indium tin oxide layer on the polymer tape and on the alignment mark areas; making the plural of alignment marks within those alignment mark areas; making an electronic component on the polymer tape of the flexible substrate; and separating the flexible substrate from the substrate holder using an unstressed cutting machine.

Furthermore, the present invention also provides an alignment precision enhancement device of an electronic component process on a flexible substrate comprising a substrate holder for carrying the flexible substrate; a press machine for completely sticking the flexible substrate on the substrate holder by a polymer tape; and an unstressed cutting machine for performing an unstressed cut according to positions of the plural of alignment marks and along the width of the flexible substrate so as to separate the flexible substrate from the substrate holder.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

Figure 1A:
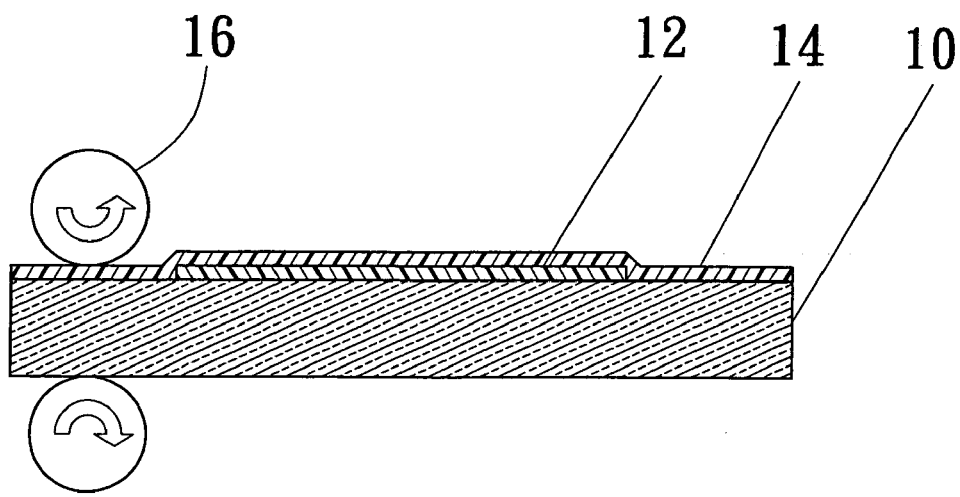
FIGS. 1A to 1G are flow charts showing an alignment precision enhancement method of electronic component process on a flexible substrate according to a first embodiment of the present invention.

FIGS. 1A to 1G are flow charts showing an alignment precision enhancement method of electronic component process on a flexible substrate according to a first embodiment of the present invention. In FIG. 1A, a flexible substrate 12 is set up on a substrate holder 10, wherein the substrate holder is made of glass or quartz, and the flexible substrate is a polymer substrate, an organic/inorganic mixed substrate, a metal substrate or a glass substrate. Then, the flexible substrate 12 and the substrate holder 10 are completely bound by a polymer tape 14 through a press machine 16 using a roll-to-roll process, and the flexible substrate 12 can be adhesively fixed on the substrate holder 10 through the polymer tape 14, wherein the polymer tape is made of polymer or an organic/inorganic mixed polymer complex material.

Figure 1B:
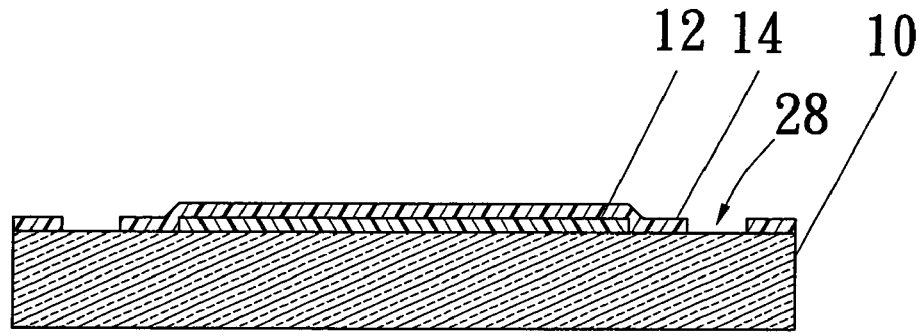
Figure 1C:
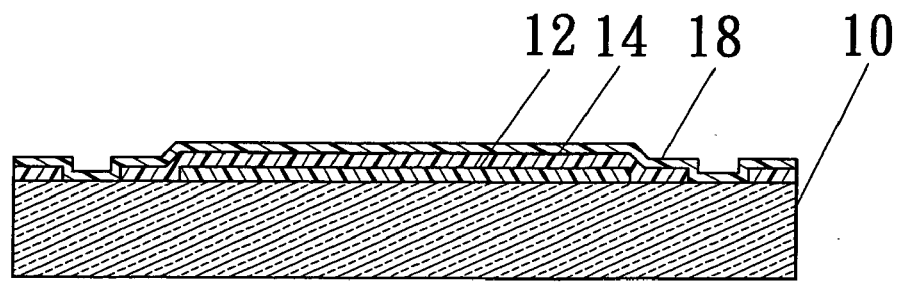
Figure 1D:
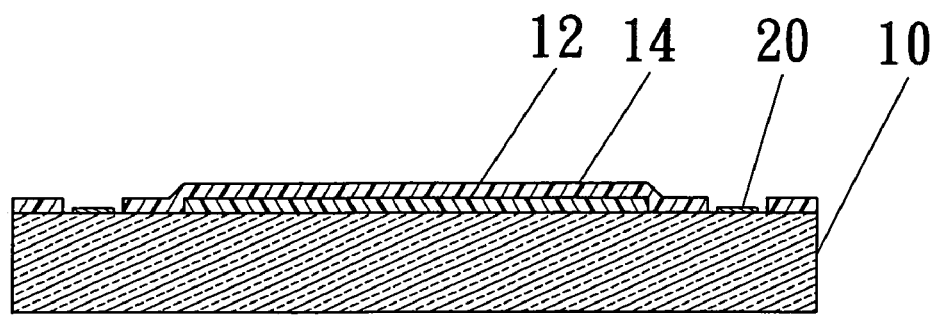

As shown in FIG. 1B, a plural of alignment mark areas 28 are set up and the polymer tape 14 within those alignment mark areas 28 are removed, wherein the removing step can be performed through an UV exposure. Then, as shown in FIG. 1C, an indium tin oxide (ITO) layer 18 is deposited on the polymer tape 14 and on the alignment mark areas 28, wherein the depositing step is achieved by sputtering. In FIG. 1D, a plural of alignment marks 20 are made within these alignment mark areas 28, wherein these alignment marks 20 are made by a lithographic process, and at the same time, a photomask is also used for eliminating the remainder of the ITO layer 18.

Figure 1E:
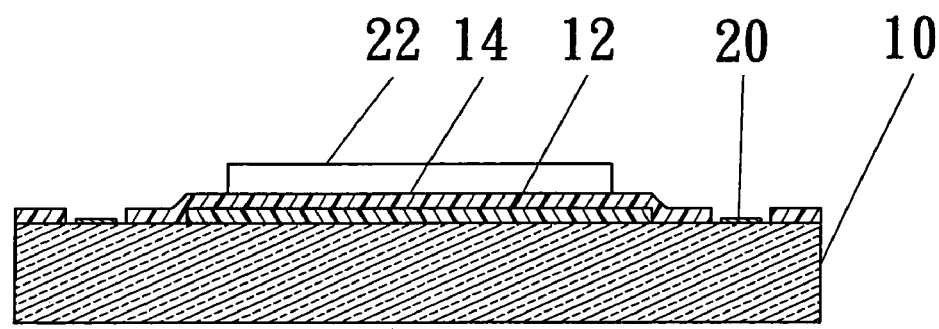
Figure 1F:
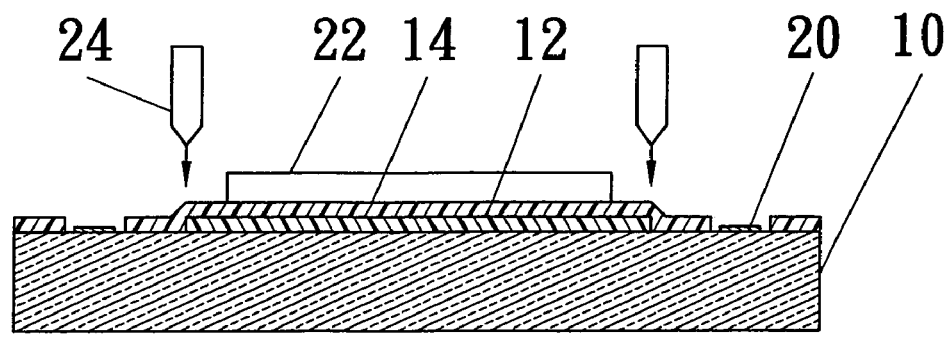
Figure 1G:
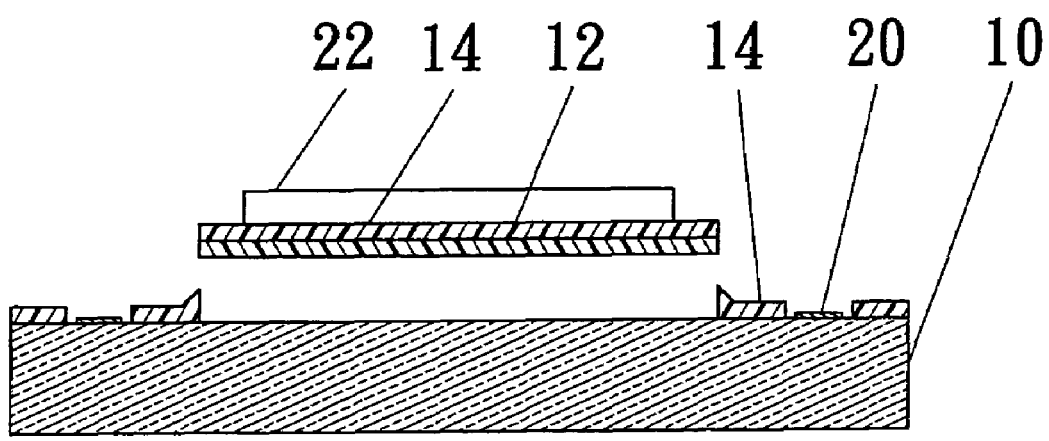
Figure 3:
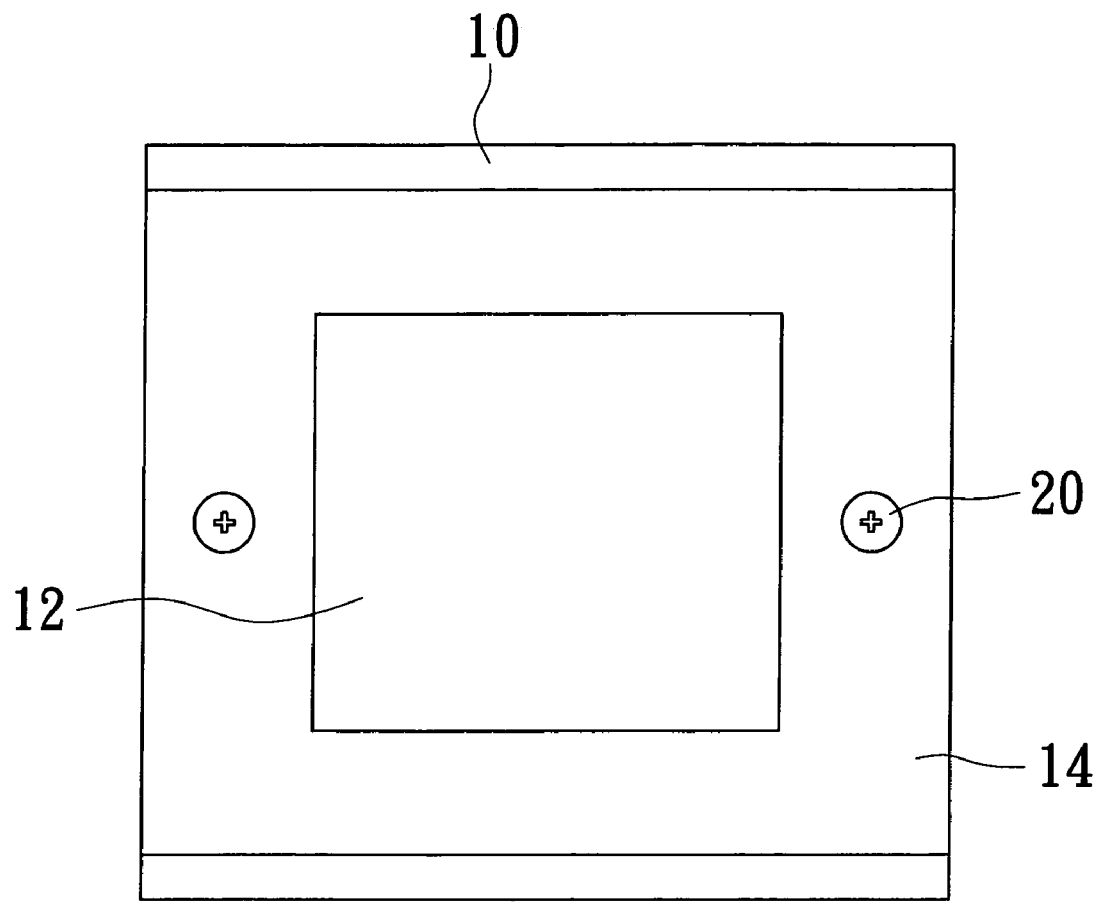
FIG. 3 is a top view showing the alignment precision of electronic component process on a flexible substrate according to the present invention.

In FIG. 1E, an electronic component 22 is made on the polymer tape 14, wherein the width of the electronic component 22 is smaller than that of the polymer tape 14 and of the flexible substrate 12. In FIG. 1F, an unstressed cutting machine 24 is employed to separate the flexible substrate 12 from the substrate holder 10, and as shown in FIG. 3 which is a top view for alignment precision, after an unstressed cut along the width of the flexible substrate 12 and according to the positions of these alignment marks 20, the flexible substrate 12 can be easily separated from the substrate holder 10. The result thereof is shown in FIG. 1G.

Figure 2A:
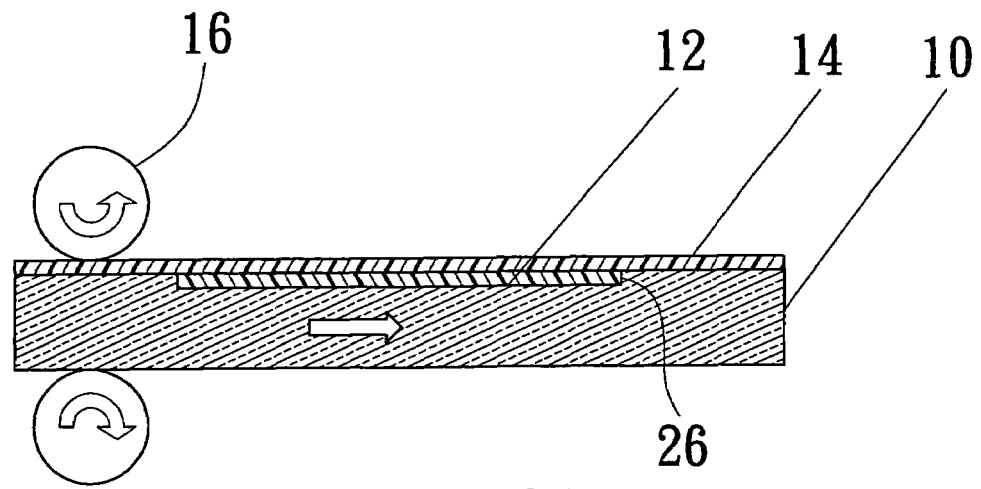
FIGS. 2A to 2G are flow charts showing an alignment precision enhancement method for electronic component process on a flexible substrate according to a second embodiment of the present invention.

FIGS. 2A to 2G are flow charts showing an alignment precision enhancement method of electronic component process on a flexible substrate according to a second embodiment of the present invention. In FIG. 2A, a groove 26 is made on the substrate holder 10 and the flexible substrate 12 is placed in the groove 26, wherein the substrate holder 10 is made of glass or quartz, and the flexible substrate 12 is a polymer substrate, an organic/inorganic mixed substrate, a metal substrate or a glass substrate. Then, the flexible substrate 12 and the substrate holder 10 are completely coated by a polymer tape 14 through a press machine 16 using a roll-to-roll process, and through the polymer tape 14, the flexible substrate 12 can be adhesively fixed on the substrate holder 10, wherein the press machine performs the adhering process in a roll-to-roll manner.

Figure 2B:
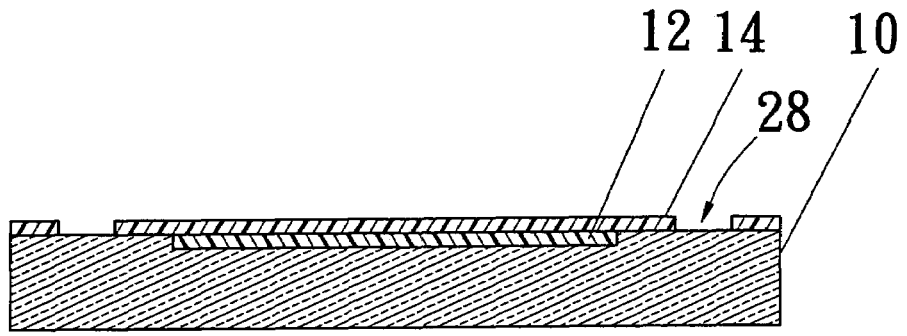
Figure 2C:
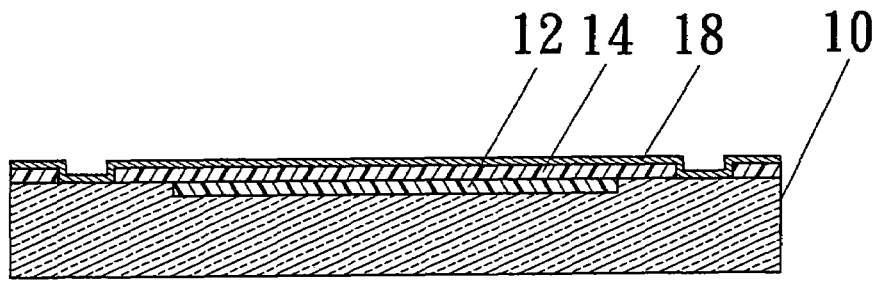
Figure 2D:
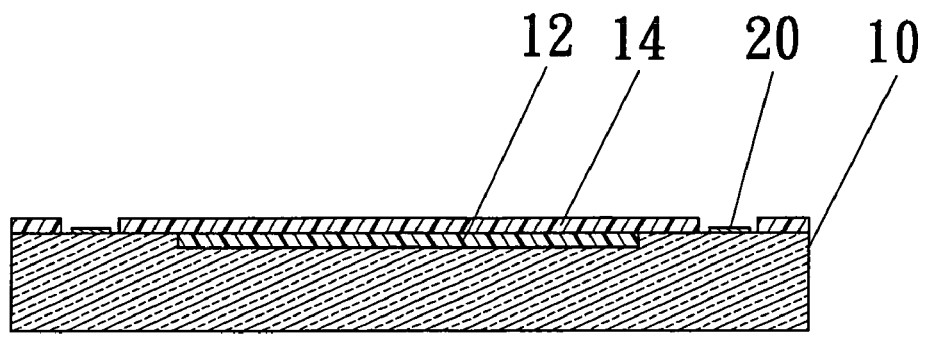

As shown in FIG. 2B, a plural of alignment mark areas 28 are placed and the polymer tape 14 within those alignment mark areas 28 are removed, wherein the removing step can be performed in an UV exposure manner. Then, as shown in FIG. 2C, an indium tin oxide (ITO) layer 18 is deposited on the polymer tape 14 and on the alignment mark areas 28, wherein the polymer tape 14 is made of polymer or an organic/inorganic mixed macromolecular complex material, and the depositing step is achieved by sputtering. In FIG. 2D, the plural of alignment marks 20 are made within these alignment mark areas 28, wherein these alignment marks 20 are made by a lithographic process, and at the same time, a photomask is also used for eliminating the remainder of the ITO layer 18.

Figure 2E:
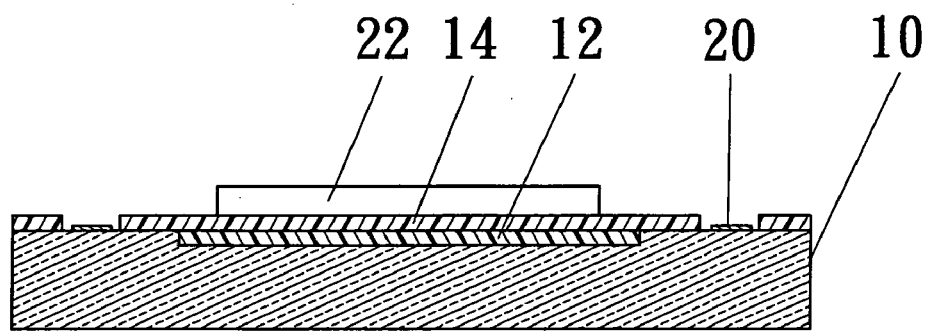
Figure 2F:
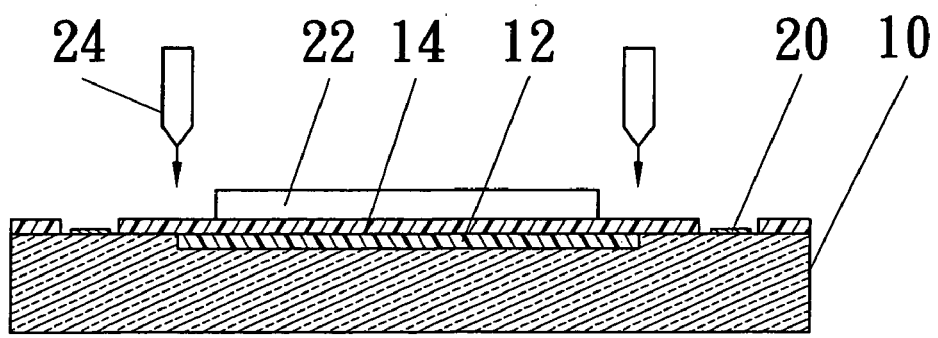
Figure 2G:
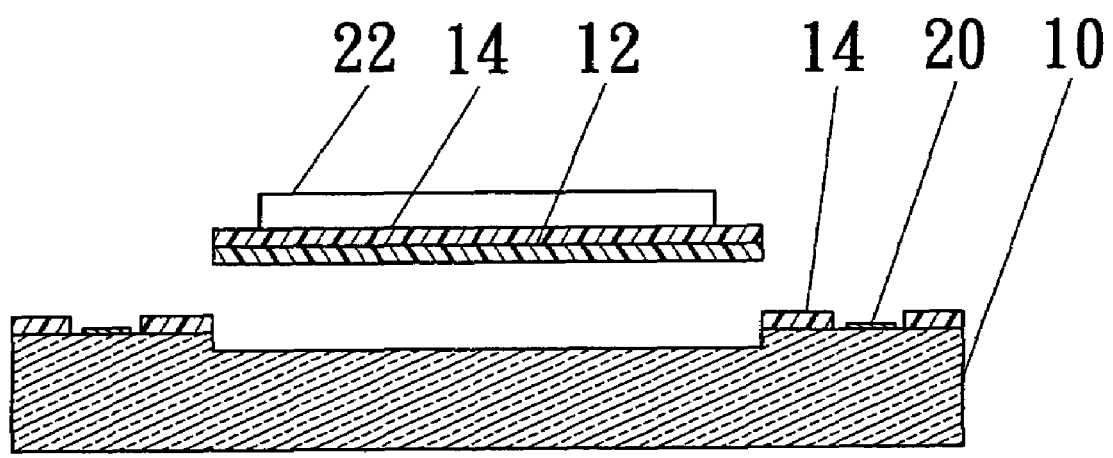

In FIG. 2E, an electronic component 22 is made on the polymer tape 14, wherein the width of the electronic component 22 is smaller than that of the polymer tape 14 and of the flexible substrate 12. In FIG. 2F, an unstressed cutting machine 24 is employed to separate the flexible substrate 12 from the substrate holder 10, and as shown in FIG. 3 which is a top view for alignment precision, after an unstressed cut along the width of the flexible substrate 12 and according to the positions of these alignment marks 20, the flexible substrate 12 can be easily separated from the substrate holder 10. The result thereof is shown in FIG. 2G According to the present invention, the flexible substrate is firstly placed on the substrate holder and adhesively fixed by a polymer tape, and then the alignment marks are made. After making the component, the flexible substrate and the substrate holder can be easily separated by the unstressed cutting machine in an unstressed cut manner. This method can avoid the flexible substrate from the problems of binder flatness, alignment, and residual binder after separating the flexible from the substrate holder, and can also be compatible with the roll-to-roll process It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An alignment precision enhancement method of an electronic component process on a flexible substrate comprising the steps of:
   placing said flexible substrate on a substrate holder;
   completely sticking said flexible substrate to said substrate holder by covering said flexible substrate with a polymer tape and pressing said polymer tape and said flexible substrate towards said substrate holder with a press machine, thereby adhesively fixing said flexible substrate to said substrate holder by said polymer tape;
   setting up a plural of alignment mark areas by removing said polymer tape within said alignment mark areas;
   depositing or printing a metal or oxide layer on said polymer tape and also on said substrate holder within said alignment mark areas;
   making an alignment mark within each of said alignment mark areas;
   making an electronic component on said polymer tape located above said flexible substrate; and
   separating said flexible substrate, said polymer tape, and said electronic component from said substrate holder by cutting said polymer tape with an unstressed cutting machine.

2. The method according to claim 1, wherein said substrate holder is made of glass, quartz, metal or ceramic.

3. The method according to claim 1, wherein said flexible substrate is a polymer substrate, an organic and inorganic mixed substrate, a metal substrate or a glass substrate.

4. The method according to claim 1, wherein the press machine carries out the adhesion in a roll-to-roll manner.

5. The method according to claim 1, wherein said polymer tape is made of polymer or an organic/inorganic mixed polymer complex material.

6. The method according to claim 1, wherein said alignment marks are made by a lithographic process.

7. The method according to claim 1, wherein the width of said electronic component is smaller than that of said polymer tape and of said flexible substrate.

8. An alignment precision enhancement method of an electronic component process on a flexible substrate comprising the steps of:
    making a groove on a substrate holder and placing said flexible substrate in said groove;
    completely sticking said flexible substrate to said substrate holder by covering said flexible substrate with a polymer tape and pressing said polymer tape and said flexible substrate towards said substrate holder with a press machine, thereby adhesively fixing said flexible substrate to said substrate holder by said polymer tape;
    setting up a plural of alignment mark areas by removing said polymer tape within said alignment mark areas;
    depositing or printing a metal or oxide layer on said polymer tape and also on said substrate holder within said alignment mark areas;
    making an alignment mark within each of said alignment mark areas;
    making an electronic component on said polymer tape located above said flexible substrate; and
    separating said flexible substrate, said polymer tape, and said electronic component from said substrate holder by cutting said polymer tape with an unstressed cutting machine.

9. The method according to claim 8, wherein said substrate holder is made of glass, quartz, metal or ceramic.

10. The method according to claim 8, wherein said flexible substrate is a polymer substrate, an organic and inorganic mixed substrate, a metal substrate or a glass substrate.

11. The method according to claim 8, wherein the press machine carries out the adhesion in a roll-to-roll manner.

12. The method according to claim 8, wherein said polymer tape is made of polymer or an organic/inorganic mixed polymer complex material.

13. The method according to claim 8, wherein said alignment marks are made by a lithographic process.

14. The method according to claim 8, wherein the width of said electronic component is smaller than that of said polymer tape and of said flexible substrate.

* * * * *